(12) United States Patent
Chang et al.

(10) Patent No.: US 9,417,640 B2
(45) Date of Patent: Aug. 16, 2016

(54) INPUT PIN CONTROL

(71) Applicant: Macronix International Co., Ltd., Hsinchu (TW)

(72) Inventors: Kuen-Long Chang, Taipei (TW); Ken-Hui Chen, Hsinchu (TW); Chin-Hung Chang, Tainan (TW); Chao-Hsin Lin, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 58 days.

(21) Appl. No.: 14/274,237

(22) Filed: May 9, 2014

(65) Prior Publication Data

US 2015/0323946 A1    Nov. 12, 2015

(51) Int. Cl.
 *H03K 17/22* (2006.01)
 *G05F 1/46* (2006.01)

(52) U.S. Cl.
 CPC *G05F 1/46* (2013.01); *G05F 1/468* (2013.01); *H03K 17/22* (2013.01)

(58) Field of Classification Search
 CPC .... H03K 17/22; H03K 17/223; H03K 17/224
 See application file for complete search history.

(56) References Cited

U.S. PATENT DOCUMENTS

| | | | | |
|---|---|---|---|---|
| 4,806,793 A * | 2/1989 | Golab | | 327/525 |
| 5,331,220 A * | 7/1994 | Pierce | | H03K 19/00361 326/122 |
| 5,349,243 A | 9/1994 | McClure | | |
| 5,438,279 A * | 8/1995 | Masumoto | | 326/38 |
| 5,500,611 A * | 3/1996 | Popat | | H03K 19/18585 326/57 |
| 5,754,879 A * | 5/1998 | Johnston | | 712/39 |
| 5,909,375 A * | 6/1999 | McClintock | | G01R 31/3181 716/106 |
| 6,020,760 A * | 2/2000 | Sample et al. | | 326/41 |
| 6,237,090 B1 * | 5/2001 | Alavoine | | 713/1 |
| 6,271,675 B1 * | 8/2001 | Sakaki | | 324/762.02 |
| 6,335,648 B1 * | 1/2002 | Matsushita | | H03K 19/1731 326/57 |
| 6,448,812 B1 * | 9/2002 | Bacigalupo | | H03K 19/0016 326/121 |
| 6,539,511 B1 * | 3/2003 | Hashizume | | 714/727 |
| 6,573,753 B1 * | 6/2003 | Snyder | | H03K 19/018585 326/81 |
| 6,762,632 B1 * | 7/2004 | Himpe et al. | | 327/142 |
| 6,947,323 B2 * | 9/2005 | Naso et al. | | 365/185.04 |
| 6,998,884 B2 * | 2/2006 | Ng | | H03K 17/223 327/143 |
| 7,058,827 B2 * | 6/2006 | Rose | | G06F 1/3209 326/30 |

(Continued)

*Primary Examiner* — Thomas J Hiltunen
(74) *Attorney, Agent, or Firm* — Yiding Wu; Haynes Beffel & Wolfeld LLP (57) ABSTRACT

An integrated circuit device includes a pad adapted to receive a signal from an external driver. A state register is programmed with a state that indicates a voltage level to set for the pad during initialization of circuitry on the integrated circuit device responsive to the state for the pad. The voltage level may correspond to a logic low level or a logic high level. A voltage holding circuit is coupled to the pad and the state register, and is configured to force the pad to the voltage level in response to an event that causes the initialization.

18 Claims, 7 Drawing Sheets

(56) References Cited

U.S. PATENT DOCUMENTS

| | | | |
|---|---|---|---|
| 7,133,300 B1 * | 11/2006 | Yang | H02H 7/122 323/284 |
| 7,301,386 B2 | 11/2007 | Chen et al. | |
| 7,443,223 B2 | 10/2008 | Bajkowski et al. | |
| 7,474,132 B2 * | 1/2009 | Cheng | H03K 3/356165 327/108 |
| 7,479,807 B1 * | 1/2009 | Cheng | H03K 19/00384 326/121 |
| 7,532,047 B2 | 5/2009 | Ker et al. | |
| 7,750,694 B1 * | 7/2010 | Nguyen | 327/143 |
| 8,400,190 B2 | 3/2013 | Hung et al. | |
| 8,564,335 B1 * | 10/2013 | Weiser | H03K 19/0016 326/58 |
| 2005/0270064 A1 * | 12/2005 | Kawakami et al. | 326/57 |
| 2006/0006920 A1 | 1/2006 | Lee | |
| 2006/0038593 A1 | 2/2006 | Abe | |
| 2006/0076987 A1 | 4/2006 | Won | |
| 2008/0094918 A1 * | 4/2008 | Fujizoe | 365/189.07 |
| 2009/0219065 A1 * | 9/2009 | Shimizu | 327/143 |
| 2013/0010517 A1 * | 1/2013 | Chu | G11C 5/06 365/63 |

* cited by examiner

| Pull-Up Register 7 | Pull-Up Register 6 | Pull-Up Register 5 | Pull-Up Register 4 | Pull-Up Register 3 | Pull-Up Register 2 | Pull-Up Register 1 | Pull-Up Register 0 |
|---|---|---|---|---|---|---|---|
| PAD 7 Pull-Up Off | PAD 6 Pull-Up Off | PAD 5 Pull-Up Enable | PAD 4 Pull-Up Enable | PAD 3 Pull-Up Enable | PAD 2 Pull-Up Enable | PAD 1 Pull-Up Enable | PAD 0 Pull-Up Enable |

Figure 6

| Pull-Down Register 7 | Pull-Down Register 6 | Pull-Down Register 5 | Pull-Down Register 4 | Pull-Down Register 3 | Pull-Down Register 2 | Pull-Down Register 1 | Pull-Down Register 0 |
|---|---|---|---|---|---|---|---|
| PAD 7 Pull-Down Off | PAD 6 Pull-Down Off | PAD 5 Pull-Down Enable | PAD 4 Pull-Down Enable | PAD 3 Pull-Down Enable | PAD 2 Pull-Down Enable | PAD 1 Pull-Down Enable | PAD Pull-Down Enable |

Figure 7

INPUT PIN CONTROL

BACKGROUND

1. Field of the Invention

The present invention relates generally to integrated circuits, and more particularly to pull-up and pull-down circuitry for input/output pads of integrated circuits.

2. Description of Related Art

Integrated circuits include input/output (I/O) pads used for receiving and transmitting signals. During operation, if an I/O pad is left "floating", meaning that the pad is not being driven to a predictable voltage by external or internal drivers, the pad may float at a voltage level sufficient to cause input buffer circuitry connected to the pad to turn-on and operate unpredictably. This unpredictable operation increases power consumption for the device and may cause damage to the input buffer circuitry. A floating voltage on the pad may also place the input buffer circuitry in an indeterminate state, resulting in indeterminate signals propagating to the internal circuitry of the device and causing oscillations and other spurious effects.

In order to avoid such issues, integrated circuits may include pull-up or pull-down circuitry to bias the pad to a predictable voltage level when the pad is left in a floating condition. In one example, such as U.S. Pat. No. 8,400,190 (Issue Date 19 Mar. 2013, Chun Hsiung Hung et al.), a pad can be pre-charged to either a high reference voltage or a low reference voltage, as manufactured. However, a pad of an integrated circuit may need to be coupled to a pull-up circuitry for one application, but coupled to a pull-down circuitry for another application, depending on requirements of a system that includes the integrated circuit.

It is therefore desirable to provide improved pull-up and/or pull-down circuitry for pads of integrated circuits that allow setting individual pads to predictable voltage levels.

SUMMARY

An integrated circuit device described herein includes a pad adapted to receive a signal from an external driver, such as a user input signal driven by a bus line. A state register is programmed with a state that indicates a voltage level to set for the pad during initialization of circuitry on the integrated circuit device responsive to the state for the pad. The voltage level may for example correspond to one of a logic low level and a logic high level. A voltage holding circuit is coupled to the pad and the state register, and is configured to force the pad to the indicated voltage level in response to an event that causes the initialization. The pad can be further adapted to receive a signal from an output buffer circuit in the integrated circuit device, such that the pad can be driven by the output buffer circuit when the output buffer circuit is enabled to output data from the device to the bus line.

The voltage holding circuit can be configured to quickly set the voltage level at the pad with a first current, and to subsequently hold the voltage level at the pad with a second current weaker than the first current, where the second current is sufficiently weak such that the voltage level held at the pad is overridable by a signal applied by a driver coupled to the pad.

The integrated circuit can include a plurality of pads configured to receive signals that can have an effect during initialization. Thus, in such embodiments, a second state register can be programmed with a second state that indicates a second voltage level to set for the pad upon the initialization. A second voltage holding circuit can be coupled to the pad and the second state register, and be configured to force the pad to the second voltage level in response to the event that causes the initialization.

The second voltage holding circuit can be configured to quickly set the second voltage level at the pad with a first current, and to subsequently hold the second voltage level at the pad with a second current weaker than the first current.

A plurality of state registers can be programmed with a state indicating a voltage level to set for pads in the plurality of pads during initialization of circuitry on the integrated circuit device responsive to the state for the pads. A plurality of voltage holding circuits can be coupled to pads in the plurality of pads and state registers in the plurality of state registers, and configured to force the pads to the indicated voltage level in response to an event that causes the initialization. The pads can be further adapted to receive signals from output buffer circuits in the integrated circuit device.

A second plurality of state registers can be programmed with a second state indicating a second voltage level to set for pads in the plurality of pads upon the initialization. A second plurality of voltage holding circuits can be coupled to pads in the plurality of pads and state registers in the second plurality of state registers, and configured to force the pads to the second voltage level in response to the event that causes the initialization.

Methods for biasing a pad of an integrated circuit described herein include forcing the pad to a voltage level in response to an event that causes initialization of circuitry responsive to the external signal, where the voltage level is indicated by a state programmed in a state register.

The step of forcing the pad to a voltage level can include setting the voltage level at the pad with a first current, and subsequently holding the voltage level at the pad with a second current, where the second current is weaker than the first current, and is sufficiently weak such that the voltage level held at the pad is overridable by the external signal.

The methods can include forcing the pad to a second voltage level in response to the event that causes initialization of circuitry responsive to the external signal, where the second voltage level is indicated by a second state programmed in a second state register.

The step of forcing the pad to a second voltage level can include setting the second voltage level at the pad with a first current, and subsequently holding the second voltage level at the pad with a second current, where the second current is weaker than the first current, and is sufficiently weak such that the second voltage level held at the pad is overridable by the external signal.

Other aspects and advantages of the present invention can be seen on review of the drawings, the detailed description, and the claims which follow.

DETAILED DESCRIPTION

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Figure 1:
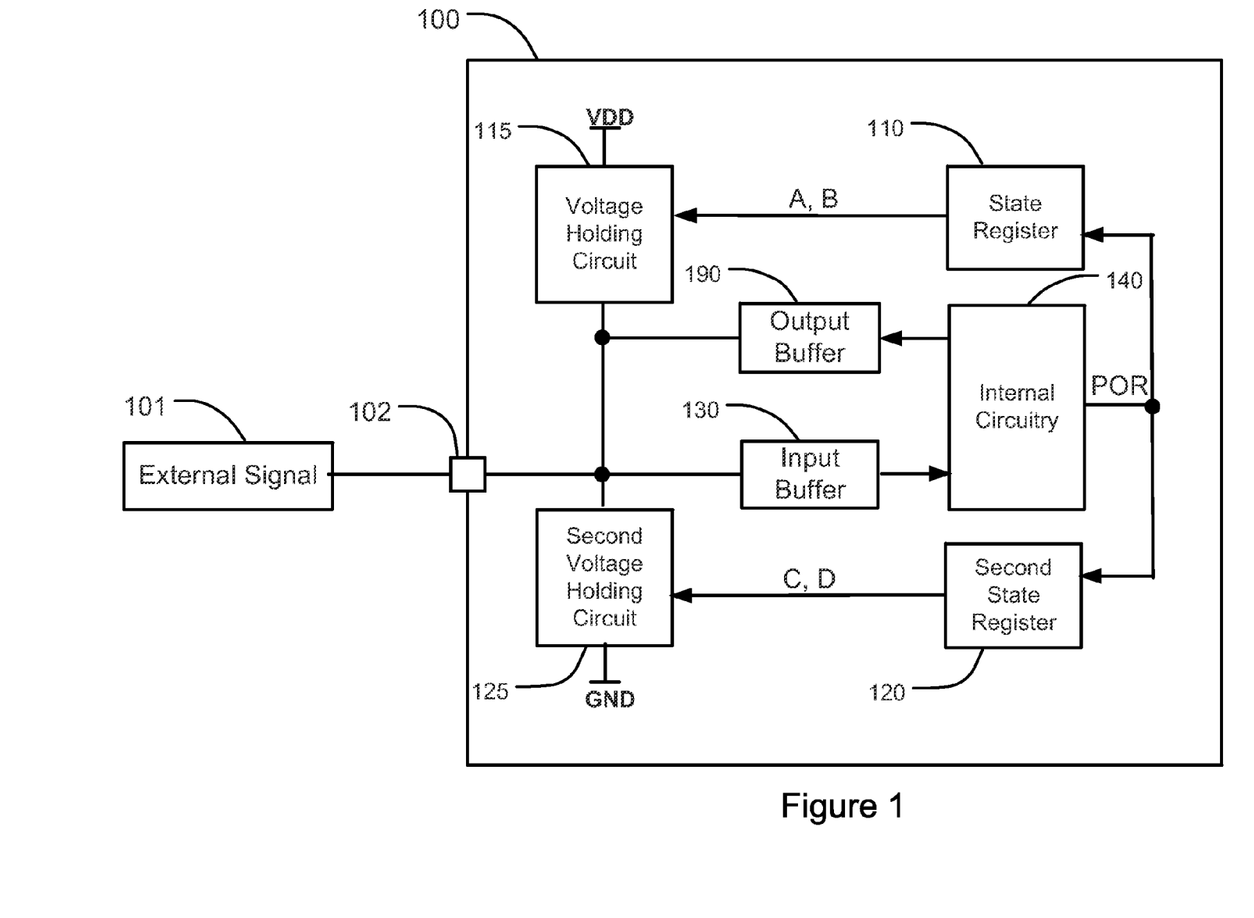
FIG. 1 is a simplified functional block diagram of input/output circuitry for a pad of an integrated circuit device.

FIG. 1 is a simplified functional block diagram of input/output circuitry for a pad 102 of an integrated circuit device 100. As used herein, the term "pad" refers to a circuit node adapted to receive a signal from an external driver, such as a user input signal driven by a bus line, or from an output buffer circuit in the integrated circuit device. For example, the pad 102 can be adapted to receive an external signal 101 when output buffer circuit 190 is disabled, or to receive a signal from output buffer circuit 190 when output buffer circuit 190 is enabled to output data from the integrated circuit device 100 to a bus line coupled to pads of the integrated circuit device including the pad 102.

As illustrated in the example of FIG. 1, the input/output circuitry for pad 102 includes a state register 110 and a voltage holding circuit 115. The state register 110 can be programmed with a state that indicates a voltage level to set for the pad during initialization of circuitry responsive to the state for the pad. The voltage level can correspond to one of a logic low level (e.g. '0') and a logic high level (e.g. '1'). The voltage holding circuit 115 is coupled to the pad 102 and the state register 115, and is configured to force the pad to the voltage level in response to an event that causes the initialization, so that the voltage level will be in a known state at initialization of the circuit. For instance, the event can be a power-on reset event (POR) generated by the internal circuitry 140 after electrical power is applied to the integrated circuit device 100. For instance, in the SPI (serial peripheral interface) standard as can be used with the present technology, the limit on input load current can be between −2 μA and 2 μA, and the strength of a weak pullup path or a weak pulldown path can be 10% of the limit, i.e., between −0.2 μA and 0.2 μA. The strength of the weak pullup or pulldown path can be modified such that the voltage at the pad is within the range of VIL (input low voltage) and VIH (input high voltage), for example as specified by the SPI standard, when the pad is forced by an external signal.

Control signals A and B are generated in this example, in response to the state programmed in the state register 110 to control the voltage holding circuit 115, and are further described in connection with FIGS. 2 and 3.

The pad 102 is connected to an input buffer circuit 130. Input voltage levels applied to the pad 102 are buffered by the input buffer circuit 130 and applied to internal circuitry 140 that responds to the voltage level on the pad, such as a controller having a state machine, power management logic, or the like. The pad 102 can also be connected to an output terminal of the output buffer circuit 190. An input terminal of the output buffer circuit 190 can be connected to the internal circuitry 140. The output buffer circuit 190 can be enabled or disabled by a control signal (not shown) from the internal circuitry 140.

The input/output circuitry for pad 102 can include a second state register 120 and a second voltage holding circuit 125. The state register 120 can be programmed with a second state that indicates a second voltage level to set for the pad during initialization of circuitry responsive to the second state for the pad. In one embodiment, the voltage level for the state register 110 can correspond to a logic high level (e.g. '1'), while the second voltage level for the second state register 120 can correspond to a logic low level (e.g. '0'). In another embodiment, the voltage level for the state register 110 can correspond to a logic low level (e.g. '0'), while the second voltage level for the second state register 120 can correspond to a logic high level (e.g. '1'). The second voltage holding circuit 125 is coupled to the pad 102 and the second state register 125, and is configured to force the pad to the second voltage level in response to the event that causes the initialization.

Control signals C and D are generated in response to the state programmed in the state register 120 to control the second voltage holding circuit 125, and are further described in connection with FIGS. 2 and 4.

Figure 2:
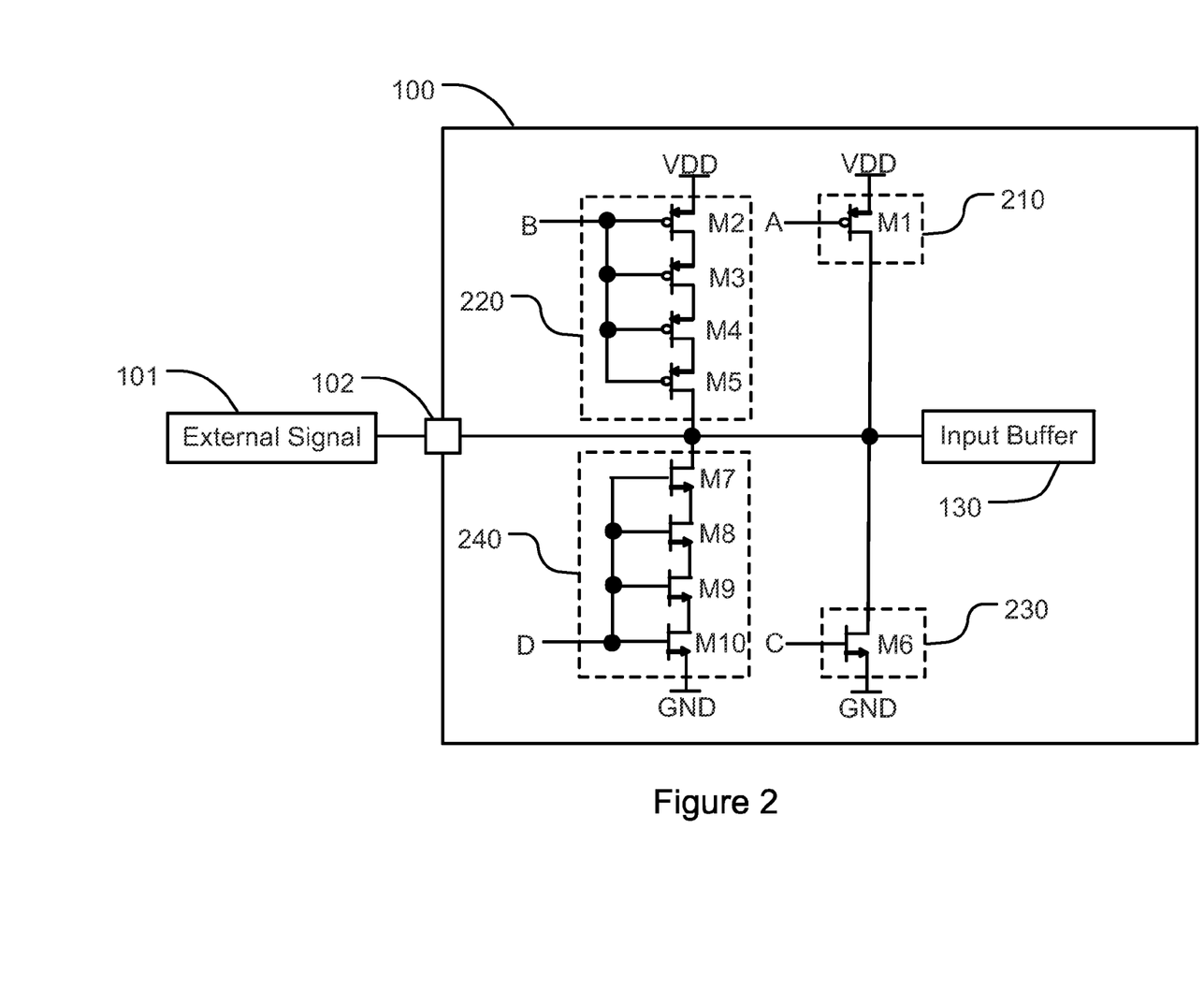
FIG. 2 is a schematic diagram of an embodiment of the voltage holding circuit and the second voltage holding circuit for the pad.

FIG. 2 is a schematic diagram of an embodiment of the voltage holding circuit 115 and the second voltage holding circuit 125. As shown in the example of FIG. 2, the voltage holding circuit 115 includes two pull-up circuits 210 and 220. The pull-up circuit 210 includes a PMOS pass transistor M1 coupled to the pad 102 at one conduction terminal, and coupled to a supply voltage VDD at another conduction terminal. The PMOS pass transistor M1 is sized to provide a strong current (high power pull-up) to the pad 102 such that the pad can reach the voltage level in a relative fast time. The pull-up circuit 210 is controlled by the control signal A, which is connected to the control terminal of the PMOS pass transistor M1.

The pull-up circuit 220 includes a set of PMOS pass transistors in series (e.g. M2-M5) coupled to the pad 102 at one end of the set, and coupled to the supply voltage VDD at another end of the set. PMOS pass transistors in the set are sized to provide a weaker current to the pad 102 (low power holding) such that the pad does not float, and the voltage level held at the pad is overridable by the external signal 101. The external signal can be applied according to a specified input signal current level, such as for example a current level specified according to the SPI standard, that can override the low current holding. In the example using the SPI standard, the low current holding can be between −0.2 μA and 0.2 μA, while an external signal can have current between −2 μA and 2 μA and thus can override the weak pullup. The pull-up circuit 220 is controlled by the control signal B, which is connected to the control terminals of the PMOS pass transistors M2-M5.

The PMOS pass transistors in the set are said to be "weak" in the sense that when a voltage less than the supply voltage VDD is asserted on the pad 102 by an external driver, or by an output buffer circuit in the integrated circuit device, the driver or the output buffer circuit provides a stronger pull-down action than the pull-up action of the PMOS pass transistors in the set. The external driver or the output buffer circuit thus "wins", and changes the voltage at the pad 102 to a known state, preventing propagating indeterminate signals to the internal circuitry of the device or to a bus line coupled to the device.

Thus, the voltage holding circuit 115 can be configured quickly to set the voltage level at the pad with a first current through the pull-up circuit 210 during initialization of the internal circuits responsive to the state for the pad, and to subsequently hold the voltage level at the pad 102 with a second current through the pull-up circuit 220 after initialization of the internal circuits responsive to the voltage level on the pad. The second current is weaker than the first current, and is sufficiently weak such that the voltage level held at the pad 102 is overridable by the external signal 101.

As shown in the example of FIG. 2, the voltage holding circuit 125 includes two pull-down circuits 230 and 240. The pull-down circuit 230 includes an NMOS pass transistor M6 coupled to the pad 102 at one conduction terminal, and coupled to a reference voltage, such as ground GND on another conduction terminal. The NMOS pass transistor M6 is sized to provide a strong current (high power pull-down) to the pad 102 such that the pad can reach the second voltage level in a relative fast time. The pull-down circuit 230 is controlled by the control signal C, which is connected to the control terminal of the NMOS pass transistor M6.

The pull-down circuit 240 includes a set of PMOS pass transistors in series (e.g. M7-M10) coupled to the pad 102 at one end of the set, and coupled to ground at another end of the set. NMOS pass transistors in the set are sized to provide a weaker current to the pad 102 (low power holding) such that the pad does not float, and the second voltage level held at the pad is overridable by the external signal 101. In the example using the SPI standard, the low current holding can be between −0.2 µA and 0.2 µA, while an external signal can have current between −2 µA and 2 µA and thus can override the weak pulldown. The pull-down circuit 240 is controlled by the control signal D, which is connected to the control terminals of the NMOS pass transistors M7-M10.

The NMOS pass transistors in the set are said to be "weak" in the sense that when a voltage greater than the reference voltage GND is asserted on the pad 102 by an external driver, or by an output buffer circuit in the integrated circuit device, the driver or the output buffer circuit provides a stronger pull-up action than the pull-down action of the NMOS pass transistors in the set. The external driver or the output buffer circuit thus "wins", and changes the voltage at the pad 102 to a known state.

Thus, the voltage holding circuit 125 can be configured quickly to set the second voltage level at the pad with a first current through the pull-down circuit 230 during initialization of the internal circuits responsive to the state for the pad, and to subsequently hold the second voltage level at the pad 102 with a second current through the pull-down circuit 240 after initialization of the internal circuits responsive to the voltage level on the pad. The second current is weaker than the first current, and is sufficiently weak such that the second voltage level held at the pad 102 is overridable by the external signal 101.

Figure 3:
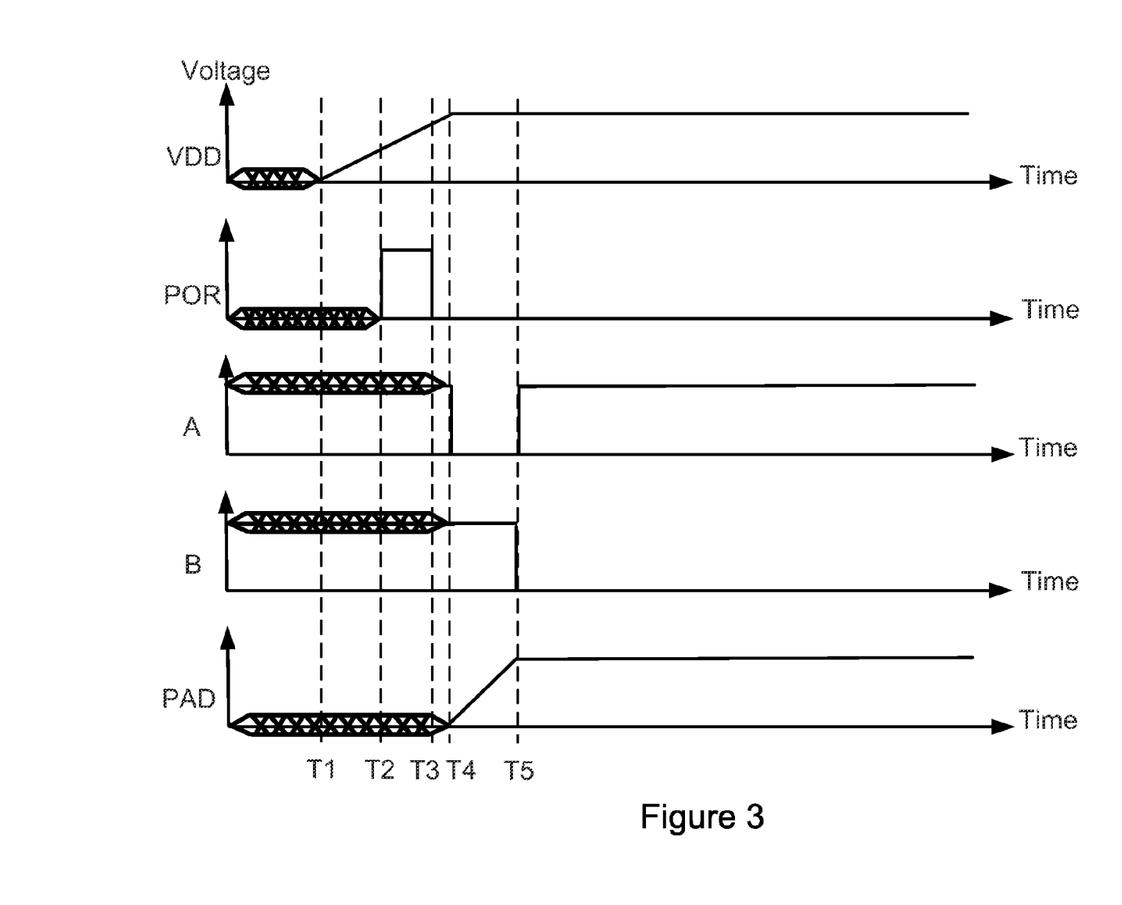
FIG. 3 illustrates an embodiment of a timing diagram for operating the architecture including the voltage holding circuit of FIGS. 1 and 2.

FIG. 3 illustrates an embodiment of a timing diagram for operating the architecture including the voltage holding circuit of FIGS. 1 and 2 using the methods described herein. As will be understood the timing diagram of FIG. 3 is simplified and not necessarily to scale.

The sequence begins at time T1 in response to an initialization event. In the illustrated example, the initialization event is a power-on event during which the internal circuitry 140 generates a power-on reset "POR" signal in response to the application of power to the integrated circuit device 100. More generally, the initialization event may be any other event, for which a signal is generated internally or externally to begin the sequence which causes circuitry on the integrated circuit that is responsive to the voltage level on the pad to reset or restart.

During the power-on process, the POR signal is set to a high state at time T2 by the internal circuitry 140. Following the power-on process the POR signal is returned to a low state at time T3.

At time T4, control signal A is set to a low state, turning on the pull-up circuit 210 to set the voltage level at the pad 102 with a first current. At time T5, control signal B is set to a low state, turning on the pull-up circuit 220 to hold the voltage level at the pad 102 with a second current, while control signal A is set to a high state, turning off the pull-up circuit 210. As described herein, the second current is weaker than the first current, and is sufficiently weak such that the voltage level held at the pad 102 is overridable by the external signal 101.

Voltage levels are unknown or unpredictable before T1 for VDD, before T2 for POR, and before T4 for A, B, and PAD. After T5, the device and method described herein ensure that the input buffer circuit (e.g. 130) is in a known state following the initialization event.

Figure 4:
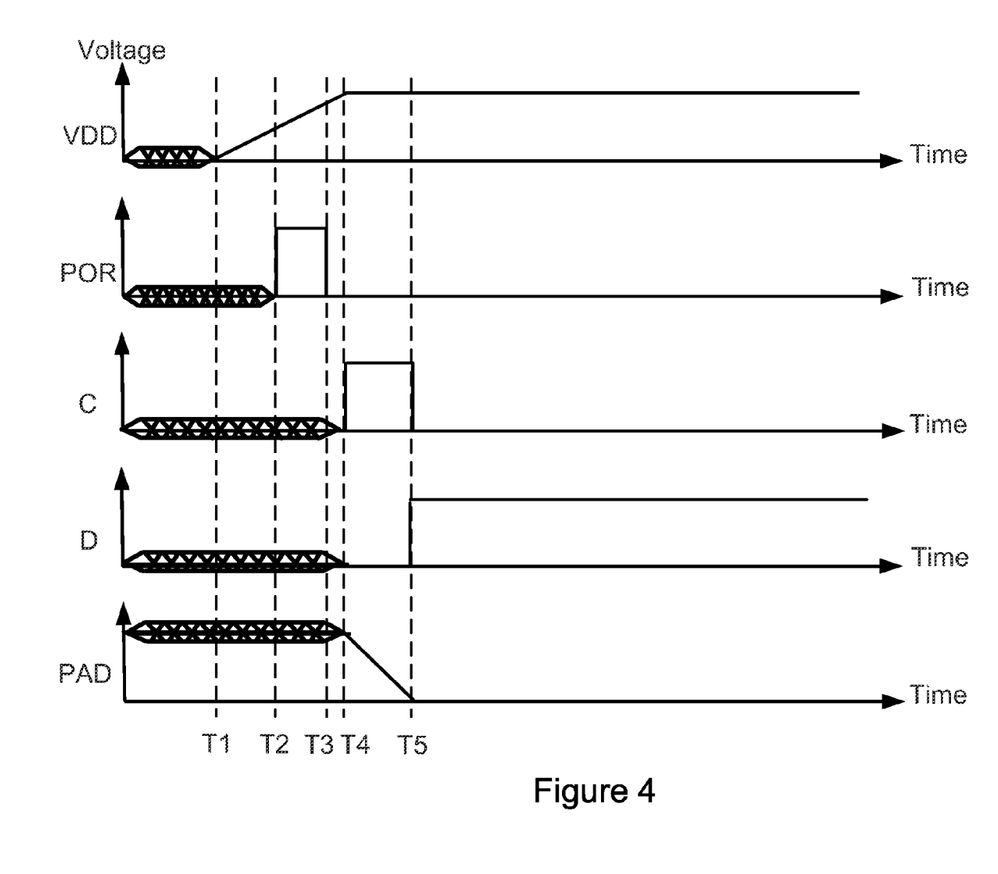
FIG. 4 illustrates an embodiment of a timing diagram for operating the architecture including the second voltage holding circuit of FIGS. 1.

FIG. 4 illustrates an embodiment of a timing diagram for operating the architecture including the second voltage holding circuit of FIGS. 1 and 2 using the methods described herein. As will be understood the timing diagram of FIG. 4 is simplified and not necessarily to scale.

The sequence begins at time T1 in response to an initialization event. In the illustrated example, the initialization event is a power-on event during which the internal circuitry 140 generates a power-on reset "POR" signal in response to the application of power to the integrated circuit device 100. More generally, the initialization event may be any other event which could lead to an indeterminate floating voltage on the pad, for which a signal is generated internally or externally to begin the sequence.

During the power-on process, the POR signal is set to a high state at time T2 by the internal circuitry 140. Following the power-on process the POR signal is returned to a low state at time T3.

At time T4, control signal C is set to a high state, turning on the pull-down circuit 230 to set the second voltage level at the pad 102 with a first current. At time T5, control signal D is set to a high state, turning on the pull-down circuit 240 to hold the voltage level at the pad 102 with a second current, while control signal C is set to a low state, turning off the pull-down circuit 230.

Voltage levels are unknown or unpredictable before T1 for VDD, before T2 for POR, and before T4 for A, B, and PAD. After T5, the device and method described herein ensure that the input buffer circuit (e.g. 130) is in a known state following the initialization event.

Figure 5:
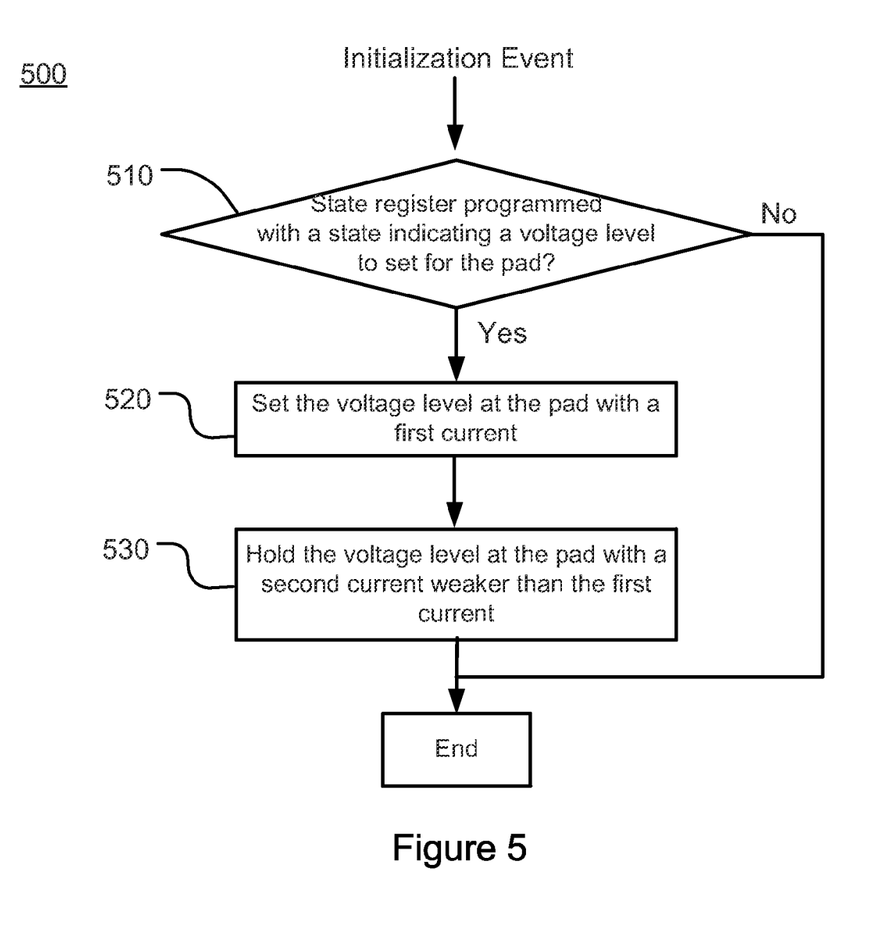
FIG. 5 is a flow chart of a method for biasing the pad.

FIG. 5 is a flow chart of a method 500 for biasing the pad 102. The method 500 begins at step 510 in response to an initialization event. The initialization event may be, for example, a power-up event of the device 100, or any other event which could lead to an indeterminate floating voltage on the pad 102. If a state register is programmed with a state indicating a voltage level to set for the pad (step 510), then the pad can be forced to the voltage level in two steps. At step 520, the voltage level is set at the pad with a first current, and at step 530, the voltage level at the pad is held with a second current. The second current is weaker than the first current, and is sufficiently weak such that the voltage level held at the pad is overridable by the external signal. The voltage level corresponds to a logic low level or a logic high level. If the voltage level is not forced to such a voltage level, an indeterminate floating voltage can remain on the pad 102.

Figure 6:
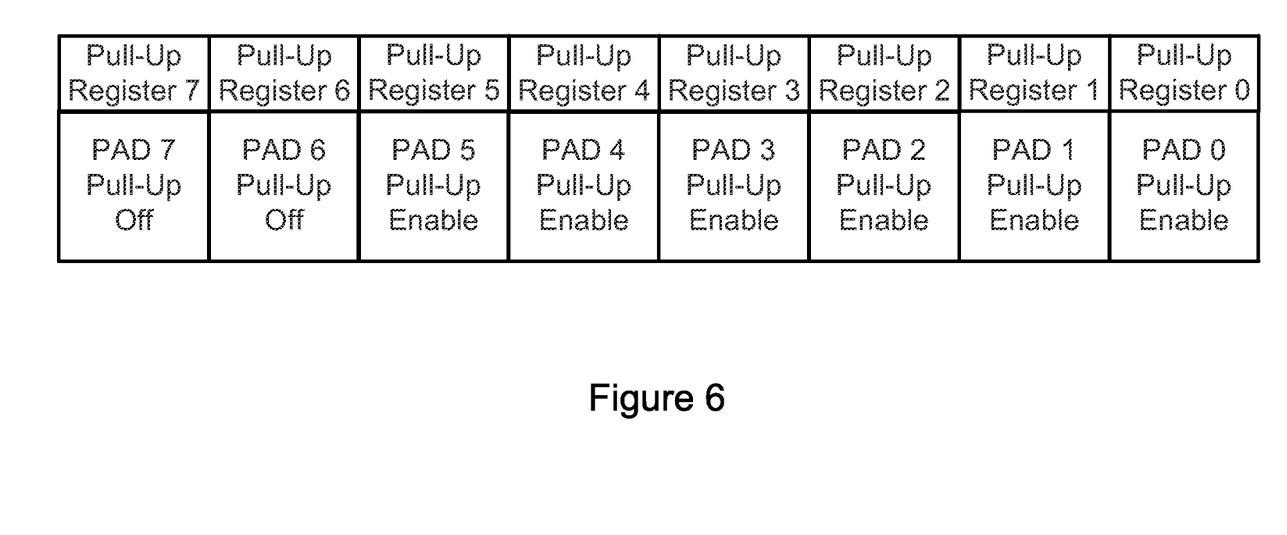
FIG. 6 illustrates a plurality of pull-up state registers for a plurality of pads in an integrated circuit device.

FIG. 6 illustrates a plurality of pull-up state registers for a plurality of pads in an integrated circuit device. As illustrated in the example of FIG. 6, pull-up state registers 0-7 correspond to pads 0-7 adapted to receive respective external signals or signals from output buffer circuits in the integrated circuit device. Pull-up state registers 0-5 are programmed with a pull-up enable state that indicates to set a voltage level corresponding to a logic high level for respective pads 0-5 in response to an event, such as a POR event, that causes initialization of the circuitry responsive to the external signal. Pull-up state registers 6-7 are programmed with a pull-up off state, so a voltage level corresponding to a logic high level is not to be set for respective pads 6-7 in response to the event.

Figure 7:
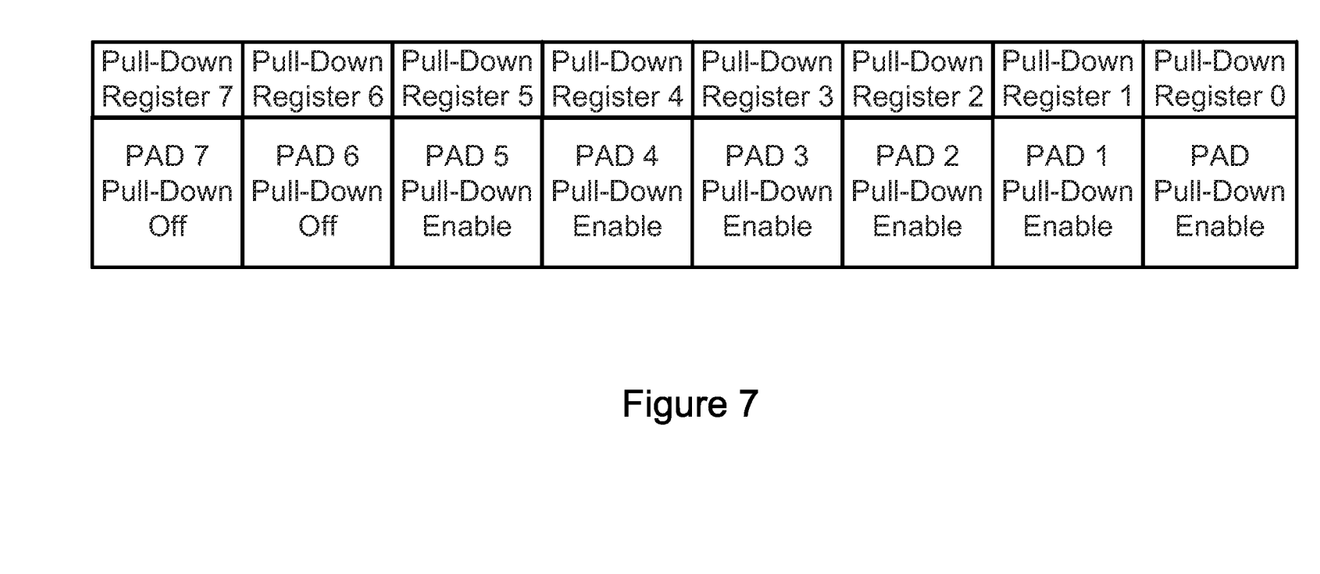
FIG. 7 illustrates a plurality of pull-down state registers for a plurality of pads in an integrated circuit device.

FIG. 7 illustrates a plurality of pull-down state registers for a plurality of pads in an integrated circuit device. As illustrated in the example of FIG. 7, pull-down state registers 0-7 correspond to pads 0-7 adapted to receive respective external signals or signals from output buffer circuits in the integrated circuit device. Pull-down state registers 0-5 are programmed with a pull-down enable state that indicates to set a voltage level corresponding to a logic low level for respective pads 0-5 in response to an event, such as a POR event, that causes initialization of the circuitry responsive to the external signal. Pull-down state registers 6-7 are programmed with a pull-down off state, so a voltage level corresponding to a logic low level is not to be set for respective pads 6-7 in response to the event.

If the pull-up state register for a pad is not set to the pull-up enable state, the pull-down state register for the pad is not set to the pull-down enable state, and the pad is not being driven to a predictable voltage by external drivers or output buffer circuits in the integrated circuit device, then the pad remains "floating" after the initialization of circuitry responsive to the external signal.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device comprising:
   a state register programmed with a state indicating a voltage level to set for a pad; and
   a voltage holding circuit coupled to the pad and the state register, and configured to force the pad to the voltage level in response to an event,
   wherein the voltage holding circuit is configured to set the voltage level at the pad with a first current in response to the event, and to subsequently hold the voltage level at the pad with a second current weaker than the first current in response to the event, wherein the second current is sufficiently weak such that the voltage level held at the pad is overridable by an external driver, the first current is turned off when the voltage level is held at the pad with the second current, and the event indicates supply voltage to the integrated circuit device transitioning from an unknown voltage level to a power-on voltage level.

2. The device of claim 1, wherein the pad is adapted to receive a signal from the external driver.

3. The device of claim 1, wherein the voltage level is set for the pad during initialization of circuitry on the device responsive to the state for the pad.

4. The device of claim 3, wherein the event causes said initialization.

5. The device of claim 1, wherein the pad is further adapted to receive a signal from an output buffer circuit in the integrated circuit device.

6. The device of claim 1, wherein the event is a power-on reset event.

7. An integrated circuit device comprising:
   a plurality of state registers programmed with a state indicating a voltage level to set for pads in a plurality of pads; and
   a plurality of voltage holding circuits coupled to pads in the plurality of pads and state registers in the plurality of state registers, and configured to force the pads to the voltage level in response to an event,
   wherein voltage holding circuits in the plurality of voltage holding circuits are configured to set the voltage level at the pads with a first current in response to the event, and to subsequently hold the voltage level at the pads with a second current weaker than the first current in response to the event, wherein the second current is sufficiently weak such that the voltage level held at the pads is overridable by external drivers, the first current is turned off when the voltage level is held at the pad with the second current, and the event indicates supply voltage to the integrated circuit device transitioning from an unknown voltage level to a power-on voltage level.

8. The device of claim 7, wherein the plurality of pads are adapted to receive signals from the external drivers.

9. The device of claim 7, wherein the voltage level is set for the pads during initialization of circuitry on the device responsive to the state for the pads in the plurality of pads.

10. The device of claim 9, wherein the event causes said initialization.

11. The device of claim 7, wherein the pads in the plurality of pads are further adapted to receive signals from output buffer circuits in the integrated circuit device.

12. A method for biasing a pad of an integrated circuit device, the pad adapted to receive an external signal, the method comprising:
   forcing the pad to a voltage level in response to an event, wherein the voltage level is indicated by a state programmed in a state register; and
   said forcing the pad to a voltage level comprising:
      setting the voltage level at the pad with a first current in response to the event; and
      subsequently holding the voltage level at the pad with a second current in response to the event,
         wherein the second current is weaker than the first current, and is sufficiently weak such that the voltage level held at the pad is overridable by the external signal, the first current is turned off when the voltage level is held at the pad with the second current, and the event indicates supply voltage to the integrated circuit device transitioning from an unknown voltage level to a power-on voltage level.

13. The method of claim 12, wherein the event causes initialization of circuitry responsive to the state for the pad.

14. An integrated circuit device comprising:
   a state register programmed with a state indicating a voltage level to set for a pad;
   a voltage holding circuit coupled to the pad and the state register, and configured to force the pad to the voltage level in response to an event;
   a second state register programmed with a second state indicating a second voltage level to set for the pad upon said initialization; and
   a second voltage holding circuit coupled to the pad and the second state register, and configured to force the pad to the second voltage level in response to the event that causes said initialization, wherein the voltage holding circuit is configured to set the voltage level at the pad with a first current in response to the event, and to subsequently hold the voltage level at the pad with a second current weaker than the first current in response to the event, wherein the second current is sufficiently weak such that the voltage level held at the pad is overridable by an external driver, wherein the pad is adapted to receive a signal from the external driver, and wherein the voltage level is set for the pad during initialization of circuitry on the device responsive to the state for the pad.

15. The device of claim 14, wherein the second voltage holding circuit is configured to set the second voltage level at the pad with a first current, and to subsequently hold the second voltage level at the pad with a second current weaker than the first current, wherein the second current is sufficiently weak such that the voltage level held at the pad is overridable by the external driver.

16. An integrated circuit device comprising:
   a plurality of state registers programmed with a state indicating a voltage level to set for pads in a plurality of pads;
   a plurality of voltage holding circuits coupled to pads in the plurality of pads and state registers in the plurality of state registers, and configured to force the pads to the voltage level in response to an event;
   a second plurality of state registers programmed with a second state indicating a second voltage level to set for pads in the plurality of pads upon said initialization; and
   a second plurality of voltage holding circuits coupled to pads in the plurality of pads and state registers in the second plurality of state registers, and configured to force the pads to the second voltage level in response to the event that causes said initialization,
   wherein voltage holding circuits in the plurality of voltage holding circuits are configured to set the voltage level at the pads with a first current in response to the event, and to subsequently hold the voltage level at the pads with a second current weaker than the first current in response to the event, wherein the second current is sufficiently weak such that the voltage level held at the pads is overridable by external drivers, and
   wherein the voltage level is set for the pads during initialization of circuitry on the device responsive to the state for the pads in the plurality of pads.

17. A method for biasing a pad of an integrated circuit device, the pad adapted to receive an external signal, the method comprising:
   forcing the pad to a voltage level in response to an event, wherein the voltage level is indicated by a state programmed in a state register;
   said forcing the pad to a voltage level comprising:
      setting the voltage level at the pad with a first current in response to the event; and
      subsequently holding the voltage level at the pad with a second current in response to the event,
         wherein the second current is weaker than the first current, and is sufficiently weak such that the voltage level held at the pad is overridable by the external signal; and
   forcing the pad to a second voltage level in response to the event, wherein the second voltage level is indicated by a second state programmed in a second state register.

18. The method of claim 17, said forcing the pad to a second voltage level comprising:
   setting the second voltage level at the pad with a first current; and
   subsequently holding the second voltage level at the pad with a second current,
   wherein the second current is weaker than the first current, and is sufficiently weak such that the second voltage level held at the pad is overridable by the external signal.

\* \* \* \* \*